(12) United States Patent
Burdt et al.

(10) Patent No.: US 12,736,886 B2
(45) Date of Patent: Sep. 15, 2026

(54) PREDICTION APPARATUS AND METHOD FOR OPTICAL SOURCE

(71) Applicant: Cymer, LLC, San Diego, CA (US)

(72) Inventors: Russell Allen Burdt, San Diego, CA (US); Jung Yoon Shin, Yongin-si (KR)

(73) Assignee: Cymer, LLC, San Diego, CA (US)

( * ) Notice: Subject to any disclaimer, the term of this patent is extended or adjusted under 35 U.S.C. 154(b) by 59 days.

(21) Appl. No.: 18/576,277

(22) PCT Filed: Jun. 6, 2022

(86) PCT No.: PCT/US2022/032335
§ 371 (c)(1),
(2) Date: Jan. 3, 2024

(87) PCT Pub. No.: WO2023/287519
PCT Pub. Date: Jan. 19, 2023

(65) Prior Publication Data

US 2024/0319612 A1 Sep. 26, 2024

Related U.S. Application Data

(60) Provisional application No. 63/221,166, filed on Jul. 13, 2021.

(51) Int. Cl.
*G03F 7/20* (2006.01)
*G03F 7/00* (2006.01)

(52) U.S. Cl.
CPC ............ *G03F 7/705* (2013.01); *G03F 7/2004* (2013.01); *G03F 7/70033* (2013.01); (Continued)

(58) Field of Classification Search
CPC .... G03F 7/705; G03F 7/2004; G03F 7/70033; G03F 7/70041; G03F 7/70525; G03F 7/70575
See application file for complete search history.

(56) References Cited

U.S. PATENT DOCUMENTS 6,455,862 B1 9/2002 van der Veen et al.
9,966,725 B1 * 5/2018 Teng .................... G01J 3/0237
(Continued)

FOREIGN PATENT DOCUMENTS

JP 2013503477 A 1/2013
JP 2020515055 A 5/2020

OTHER PUBLICATIONS

Ole Andersen, European International Searching Authority, International Search Report and Written Opinion, counterpart PCT Application No. PCT/US2022/032335, mailed Sep. 13, 2022, 13 total pages.

*Primary Examiner* — Mesfin T Asfaw
(74) *Attorney, Agent, or Firm* — DiBerardino McGovern IP Group LLC

(57) ABSTRACT

A prediction apparatus is in communication with an optical source configured to produce a pulsed light beam for use by a photolithography exposure apparatus. The prediction apparatus includes: a photolithography module in communication with the photolithography exposure apparatus and configured to receive an identifier, the received identifier lacking data relating to an actual firing pattern defining properties of the pulsed light beam; and an optical source module in communication with the optical source, the optical source module configured to provide a forecast firing pattern to the optical source. The forecast firing pattern is associated with and determined from the received identifier, and forecasts one or more properties of the actual firing pattern.

26 Claims, 10 Drawing Sheets

(52) U.S. Cl.
CPC ...... *G03F 7/70041* (2013.01); *G03F 7/70525* (2013.01); *G03F 7/70575* (2013.01)

(56) References Cited

U.S. PATENT DOCUMENTS

| | | | | |
|---|---|---|---|---|
| 2011/0102757 | A1 | 5/2011 | Butler et al. | |
| 2011/0205512 | A1* | 8/2011 | Seong | G03F 7/70525 355/67 |
| 2022/0404717 | A1* | 12/2022 | Burdt | G03F 7/70591 |

* cited by examiner 142
140
300
301
302
303
160_1
160_2
160_N
T1
T2
TN
130_1
130_2
130_N
120

PREDICTION APPARATUS AND METHOD FOR OPTICAL SOURCE

CROSS REFERENCE TO RELATED APPLICATIONS

This application claims priority to U.S. Application No. 63/221,166, filed Jul. 13, 2021, titled PREDICTION APPARATUS AND METHOD FOR OPTICAL SOURCE, which is incorporated herein in its entirety by reference.

TECHNICAL FIELD

The disclosed subject matter relates to a prediction apparatus and method for forecasting an actual firing pattern instructed by a photolithography exposure apparatus.

BACKGROUND

Photolithography is a process by which semiconductor circuitry is patterned on a substrate such as a silicon wafer. A photolithography optical source provides the ultraviolet (UV) light in the form of a UV light beam used to expose a photoresist on the wafer that is received in a photolithography exposure apparatus. Often, the light source includes a laser source and the output of the laser source is a pulsed laser beam. The UV light beam is passed through a beam delivery unit, a reticle or a mask, and then projected onto a prepared silicon wafer in the photolithography exposure apparatus. In this way, a chip design is patterned onto a photoresist that is then developed, etched and cleaned, and then the process repeats.

Typically, in a deep UV (DUV) light source, the DUV light beam for photolithography can be generated by an excimer light source such as an excimer laser. An excimer light source uses a combination of one or more noble gases, which can include argon, krypton, or xenon, and a reactive gas, which can include fluorine or chlorine. The excimer light source can create an excimer, a pseudo-molecule, under appropriate conditions of electrical simulation (energy supplied) and high pressure (of the gas mixture), the excimer only existing in an energized state. The excimer in an energized state gives rise to amplified light in the DUV range. An excimer light source can use a single gas discharge chamber or a plurality of gas discharge chambers. The DUV light beam can have a wavelength in the DUV range, which includes wavelengths from, for example, about 100 nanometers (nm) to about 400 nm.

Extreme ultraviolet (EUV) light, for example, electromagnetic radiation having wavelengths of around 50 nm or less (also sometimes referred to as soft x-rays), and including light at a wavelength of about 13 nm, can be used in photolithography processes to produce extremely small features in substrates, for example, silicon wafers. Methods to produce EUV light include, but are not necessarily limited to, converting a material that has an element, for example, xenon, lithium, or tin, with an emission line in the EUV range in a plasma state. In one such method, often termed laser produced plasma ("LPP"), the required plasma can be produced by irradiating a target material, for example, in the form of a droplet, plate, tape, stream, or cluster of material, with an amplified light beam that can be referred to as a drive laser. For this process, the plasma is typically produced in a sealed vessel, for example, a vacuum chamber, and monitored using various types of metrology equipment.

A photolithography exposure apparatus is a machine that applies a desired pattern onto a substrate, usually onto a target portion of the substrate. A photolithography exposure apparatus can be used, for example, in the manufacture of integrated circuits (ICs). In that instance, a patterning device, which is interchangeably referred to as a mask or a reticle, can be used to generate a circuit pattern to be formed on an individual layer of the IC being formed. This pattern can be transferred onto a target portion (for example, including part of, one, or several dies) on a substrate (for example, a silicon wafer). Transfer of the pattern is typically via imaging onto a layer of radiation-sensitive material (for example, resist) provided on the substrate. In general, a single substrate will contain a network of adjacent target portions that are successively patterned. Traditional photolithography exposure apparatuses include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel to this scanning direction. It is also possible to transfer the pattern from the patterning device to the substrate by imprinting the pattern onto the substrate.

Methods to produce EUV light include, but are not necessarily limited to, converting a material that has an element, for example, xenon (Xe), lithium (Li), or tin (Sn), with an emission line in the EUV range to a plasma state. For example, in one such method called laser produced plasma (LPP), the plasma can be produced by irradiating a target material, which is interchangeably referred to as fuel in the context of LPP sources, for example, in the form of a droplet, plate, tape, stream, or cluster of material, with an amplified light beam that can be referred to as a drive laser. For this process, the plasma is typically produced in a sealed vessel, for example, a vacuum chamber, and monitored using various types of metrology equipment.

SUMMARY

In some general aspects, a prediction apparatus in communication with an optical source is configured to produce a pulsed light beam for use by a photolithography exposure apparatus. The prediction apparatus includes: a photolithography module in communication with the photolithography exposure apparatus and configured to receive an identifier, the received identifier lacking data relating to an actual firing pattern defining properties of the pulsed light beam; and an optical source module in communication with the optical source, the optical source module configured to provide a forecast firing pattern to the optical source. The forecast firing pattern is associated with and determined from the received identifier, and forecasts a property of the actual firing pattern.

Implementations can include one or more of the following features. For example, the optical source module can be configured to determine the forecast firing pattern that is associated with the received identifier prior to providing the forecast firing pattern to the optical source.

The prediction apparatus can further include a forecast module configured to create the forecast firing pattern associated with the received identifier. The forecast module being configured to create the forecast pattern can include observing the actual firing pattern of the optical source a plurality of instances after receipt of the identifier.

The forecast firing pattern can improve stability of the optical source in accordance with a reduced operating space while producing the pulsed light beam in accordance with a set of stable performance specifications defined by the photolithography exposure apparatus. The reduced operating space can correspond to an operating space that is less than the full permitted operating space of the optical source for controlling the full extent of disturbances to provide the stable performance specifications. The stable performance specifications defined by the photolithography exposure apparatus can include an energy of the pulsed light beam and one or more spectral features of the pulsed light beam.

The optical source module can be in communication with one or more control modules within the optical source that are configured to enable operation of the optical source in accordance with the reduced operating space. The one or more control modules within the optical source can be configured to control operation of one or more optical oscillators and optical amplifiers of the optical source. The one or more control modules within the optical source can be configured to control operation of the one or more optical oscillators and optical amplifiers of the optical source based on a reduced operating space that is determined by the forecast firing pattern. The one or more control modules can include: an energy control module configured to control an energy of the pulsed light beam; and a spectral feature control module configured to control a spectral feature of the pulsed light beam.

The received identifier can correspond to the actual firing pattern applied to a single lot of one or more substrates positioned in the photolithography exposure apparatus, the one or more substrates being configured to receive the pulsed light beam. The forecast firing pattern that predicts the property of the actual firing pattern for the associated received identifier can indicate one or more of: the number of pulses of the pulsed light beam per burst, a repetition rate of the pulses within a burst, and an inter-burst time interval. The photolithography module can be configured to receive the identifier prior to the optical source producing the pulsed light beam in accordance with the actual firing pattern.

At any one moment in time, the photolithography module can be configured to receive a single identifier and to provide a forecast firing pattern that is associated with that single received identifier to the optical source. Over time, the photolithography module can be configured to receive a plurality of distinct identifiers and to provide a forecast firing pattern that is associated with each received identifier to the optical source.

The optical source module being configured to provide the forecast firing pattern to the optical source to enable the optical source to produce the pulsed light beam in accordance with the actual firing pattern can include providing the forecast firing pattern to the optical source in advance of the optical source receiving a request to operate based on the actual firing pattern.

The received identifier can be an alphanumeric string of characters not suitable for input to the optical source. The forecast firing pattern provided to the optical source can improve stability in the pulsed light beam produced by the optical source in accordance with the actual firing pattern. The photolithography module can be configured to receive the identifier from the photolithography exposure apparatus. The identifier can be generated by the photolithography exposure apparatus. The property can include the actual firing pattern. The property can include a repetition rate of the actual firing pattern. The property can include a reduced operating space of a control module within the optical source.

In other general aspects, an ultraviolet (UV) light source includes: a photolithography exposure apparatus configured to receive a substrate; an optical source configured to produce a pulsed light beam having a UV wavelength for use by the photolithography exposure apparatus to process the substrate; and a prediction apparatus in communication with the optical source and the photolithography exposure apparatus. The prediction apparatus is configured to: receive an identifier, the received identifier lacking data relating to an actual firing pattern defining properties of the pulsed light beam; and provide a forecast firing pattern associated with the received identifier to the optical source, the forecast firing pattern forecasting a property of the actual firing pattern.

Implementations can include one or more of the following features. For example, the pulsed light beam can have a wavelength in the deep UV range or in the extreme UV range. The forecast firing pattern provided to the optical source can improve stability in the pulsed light beam produced by the optical source in accordance with the actual firing pattern. The prediction apparatus can reside in the optical source or it can be external to the optical source.

In other general aspects, a prediction apparatus is in communication with an optical source configured to produce a pulsed light beam for use by a photolithography exposure apparatus. The prediction apparatus includes: a photolithography module in communication with the photolithography exposure apparatus and configured to receive an identifier, the received identifier lacking data relating to an actual firing pattern defining properties of the pulsed light beam; a forecast module in communication with the photolithography module and configured to create a forecast firing pattern associated with the received identifier by observing an actual firing pattern of the optical source a plurality of instances after receipt of the identifier; and an optical source module in communication with the optical source. The optical source module is configured to provide the forecast firing pattern to the optical source.

Implementations can include one or more of the following features. For example, the forecast module can be configured to create the forecast firing pattern including analyzing the observed actual firing patterns of the optical source to determine components of the actual firing pattern that are similar across all observed actual firing patterns, and creating the forecast firing pattern from the determined components. The components of the actual firing pattern can be similar across all observed actual firing patterns if there are no noticeable differences at the substrate due to any differences in the components.

In other general aspects, a method is performed for operating an optical source in accordance with a reduced operating space relative to a full permitted operating space, the operating space for controlling the full extent of disturbances to provide stable performance specifications to a photolithography exposure apparatus. The method includes: receiving an identifier, the received identifier lacking data relating to an actual firing pattern defining properties of the pulsed light beam; and providing a forecast firing pattern to the optical source. The forecast firing pattern is associated with the received identifier and forecasts the actual firing pattern.

Implementations can include one or more of the following features. For example, the method can further include, prior to providing the forecast firing pattern to the optical source, determining whether a forecast firing pattern has been created. The forecast firing pattern can be provided to the optical source by providing the forecast firing pattern to the optical source only after the forecast firing pattern has been created.

The method can further include creating the forecast firing pattern if it is determined that the forecast firing pattern has not yet been created. The forecast firing pattern can be created by: observing an actual firing pattern of the optical source a plurality of instances after receipt of the identifier; analyzing the observed actual firing patterns of the optical source to determine components of the actual firing pattern that are similar across all observed actual firing patterns; and creating the forecast firing pattern from the determined components. The components of the actual firing pattern can be similar across all observed actual firing patterns if there are no noticeable differences at the substrate due to any differences in the components. The identifier can be received by receiving the identifier from the photolithography exposure apparatus prior to the optical source producing the pulsed light beam in accordance with the actual firing pattern. The forecast firing pattern can be uniquely associated with the received identifier.

DESCRIPTION

Figures 1A, 1B:
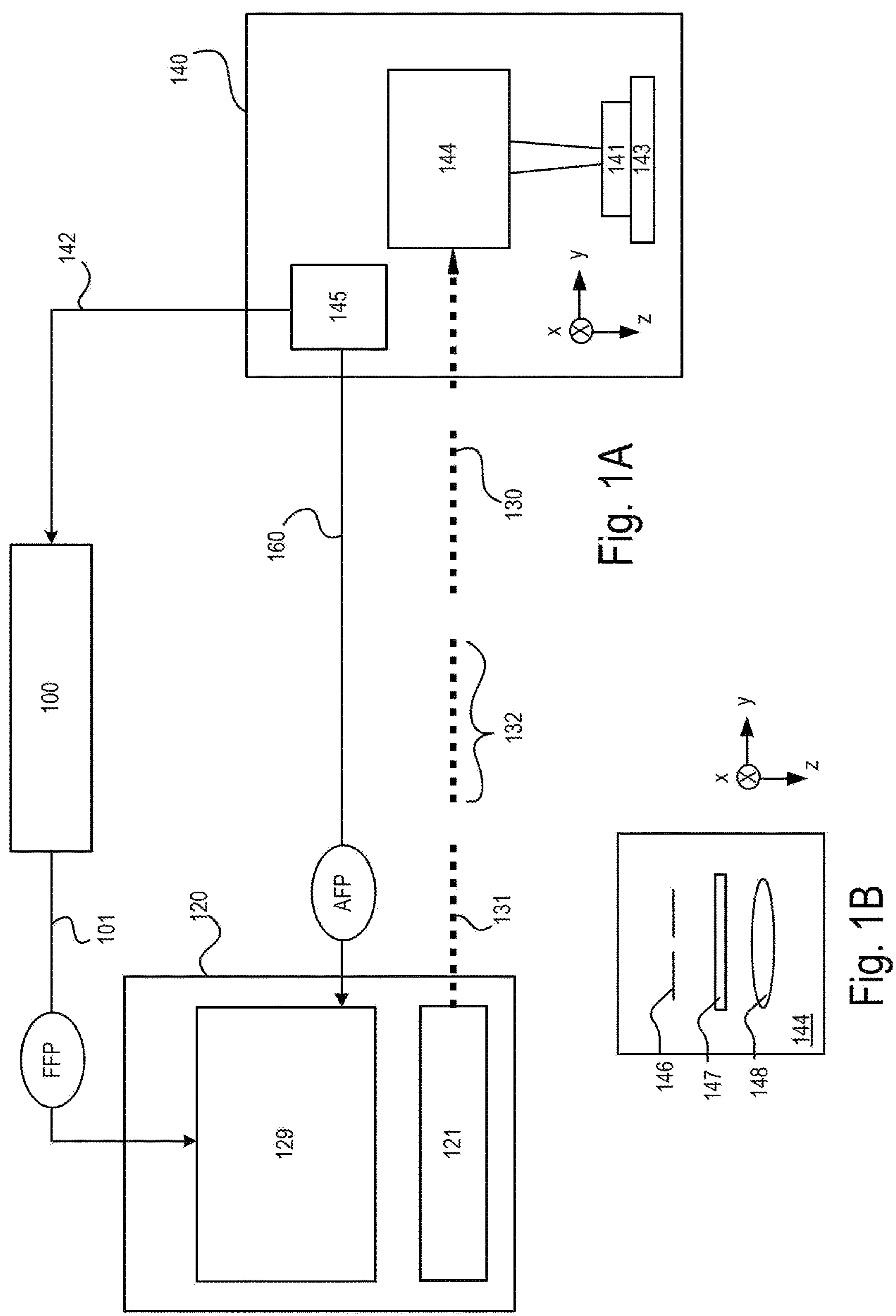
FIG. 1A is a block diagram of a prediction apparatus in communication with an optical source and a photolithography exposure apparatus, the optical source supplying a pulsed light beam to the photolithography exposure apparatus in accordance with a trigger signal from the photolithography exposure apparatus.
FIG. 1B is a block diagram of an implementations of a projection optical system within the photolithography exposure apparatus.

Referring to FIG. 1A, a prediction apparatus 100 communicates with an optical source 120 and a photolithography exposure apparatus 140. The optical source 120 supplies a pulsed light beam 130 (which is a train of pulses of a light beam) to the photolithography exposure apparatus 140. The optical source 120 supplies the pulsed light beam 130 in accordance with a trigger signal 160, which includes a train of trigger requests, from the photolithography exposure apparatus 140. Specifically, the optical source 120 includes a control apparatus 129 that receives the trigger signal 160 and analyzes the trigger signal 160, and instructs a light source 121 to produce the pulsed light beam 130 in accordance with the trigger requests within the trigger signal 160. The photolithography exposure apparatus 140 processes a substrate (or wafer) 141 with the pulsed light beam 130.

The trigger signal 160 defines an actual firing pattern AFP, the actual firing pattern defining one or more components, the components corresponding to properties [PPi] of how the pulses in the pulsed light beam 130 are produced. For example, as discussed below in more detail, the actual firing pattern defines a repetition rate RR at which pulses of the light beam 130 are produced, the number of pulses Nop of the light beam 130 that are produced in a single burst of the light beam 130, and the time Tb between bursts of the light beam 130. In this example, the actual firing pattern AFP is given by [RR, Nop, Tb]. The optical source 120 is not privy to a particular actual firing pattern AFP in advance of receiving any of the trigger requests in the trigger signal 160 that corresponds to that particular actual firing pattern. This is because the photolithography exposure apparatus 140 does not provide the optical source 120 with advance notice or information about the actual firing pattern.

In the absence of this advance notice, the optical source 120 (specifically, the control apparatus 129) assumes that it must operate in a full permitted operating space to respond to a full extent of disturbances to provide stable performance in the pulsed light beam 130 produced by the light source 121. The full operating space may include wide ranges of stable performance specifications that must be met by the optical source 120. These stable performance specifications are required by the photolithography exposure apparatus 140. This presents a significant challenge in order to design and optimize performance of the optical source 120 for stable performance specifications in such a wide operating space. It is possible to coordinate design of those modules, controllers, and actuators within the control apparatus 129 and/or the light source 121 of the optical source 120 so that intrinsic disturbances over the full operating space are limited and controlled within product specifications. However, such coordination impacts operation at the margins of operating ranges, especially as the components within the optical source 120 age, and this can lead to an increased risk that an out-of-specification pulsed light beam 130 is supplied to the photolithography exposure apparatus 140 for processing of the substrate 141 or for testing purposes. This risk can impact (reduce) the yield in processing the substrate 141.

The prediction apparatus 100 is configured to analyze information (such as an "identifier" or ID 142) that can be produced by the photolithography exposure apparatus 140, and provide a forecast firing pattern (FFP) 101 to the optical source 120. The forecast firing pattern 101 is associated with the received identifier 142. For example, the forecast firing pattern 101 can be uniquely associated with the received identifier 142. Moreover, the forecast firing pattern 101 forecasts or predicts one or more properties of the actual firing pattern AFP that will be (in the future and imminently) requested by the photolithography exposure apparatus 140 by way of the trigger signal 160. In some implementations, forecasted property is the actual firing pattern; in this way, the forecast firing pattern 101 forecasts the actual firing pattern AFP that will be requested by the photolithography exposure apparatus 140 by way of the trigger signal 160. In this case, the actual firing pattern AFP is associated with the identifier 142 with which the forecast firing pattern FFP 101 is uniquely associated. Importantly, while prediction apparatus 100 associates the actual firing pattern AFP with the identifier 142, the identifier 142 itself lacks information relating to the actual firing pattern AFP and thus it is not possible to discern the actual firing pattern AFP simply by observing the identifier 142. Additionally, the identifier 142 may be an arbitrary alphanumeric string of characters or an arbitrary binary string of bits, and this string of characters or bits is not directly suitable for input to (or use by) the optical source 120. Nevertheless, prediction apparatus 100 may be configured to ascertain actual firing patterns AFPs that correspond to particular identifiers 142, as discussed below.

In the example above, the actual firing pattern AFP is summarized or defined by pulse properties [RR, Nop, Tb]. There could exist many different actual firing patterns AFP, where each actual firing pattern AFP is associated with a particular process that is applied to the substrate 141 and therefore is associated with a distinct design applied to the substrate 141. For a particular ID, a corresponding forecast firing pattern FFP is defined by a set of forecasted values [f(PPi)] associated with these same pulse properties of the actual firing pattern AFP that is associated with that particular ID. In the above example, where the actual firing pattern AFP would be [RR, Nop, Tb], the forecast firing pattern FFP is [f(RR), f(Nop), f(Tb)], where f(RR) is the forecasted repetition rate RR, f(Nop) is the forecasted number of pulses Nop of the light beam 130 that are produced in a single burst of the light beam 130, and f(Tb) is the forecasted time Tb between bursts of the light beam 130.

The prediction apparatus 100 provides the forecast firing pattern FFP 101 in advance of the start of the trigger signal 160 for the actual firing pattern AFP. In so doing, this enables the optical source 120 to have enough time to identify and apply optimizations and improvements so that it finds a reduced operating space (reduced relative to the full permitted operating space) before the trigger signal 160 for the actual firing pattern AFP is received. In this way, the optical source 120 can still control the full extent of disturbances to thereby meet, or improve upon, the stable performance specifications for the pulsed light beam 130. The stable performance specifications may be imposed by requirements related to the processing of substrate 141 and may, for example, be specifications required by the photolithography exposure apparatus 140 for that actual firing pattern AFP. The optical source 120 can therefore maintain, improve, or optimize its performance in the reduced operating space. And, in various implementations, the optical source 120 is able to do this without the need to coordinate design of modules, controllers, and actuators. In various implementations, the optical source 120 is able to maintain, improve, or optimize its performance in real time without additional burden on the photolithography exposure apparatus 140. The photolithography exposure apparatus 140 may thus not need to modify how it operates in order to benefit from the improved performance by the optical source 120. An example follows.

Figure 2:
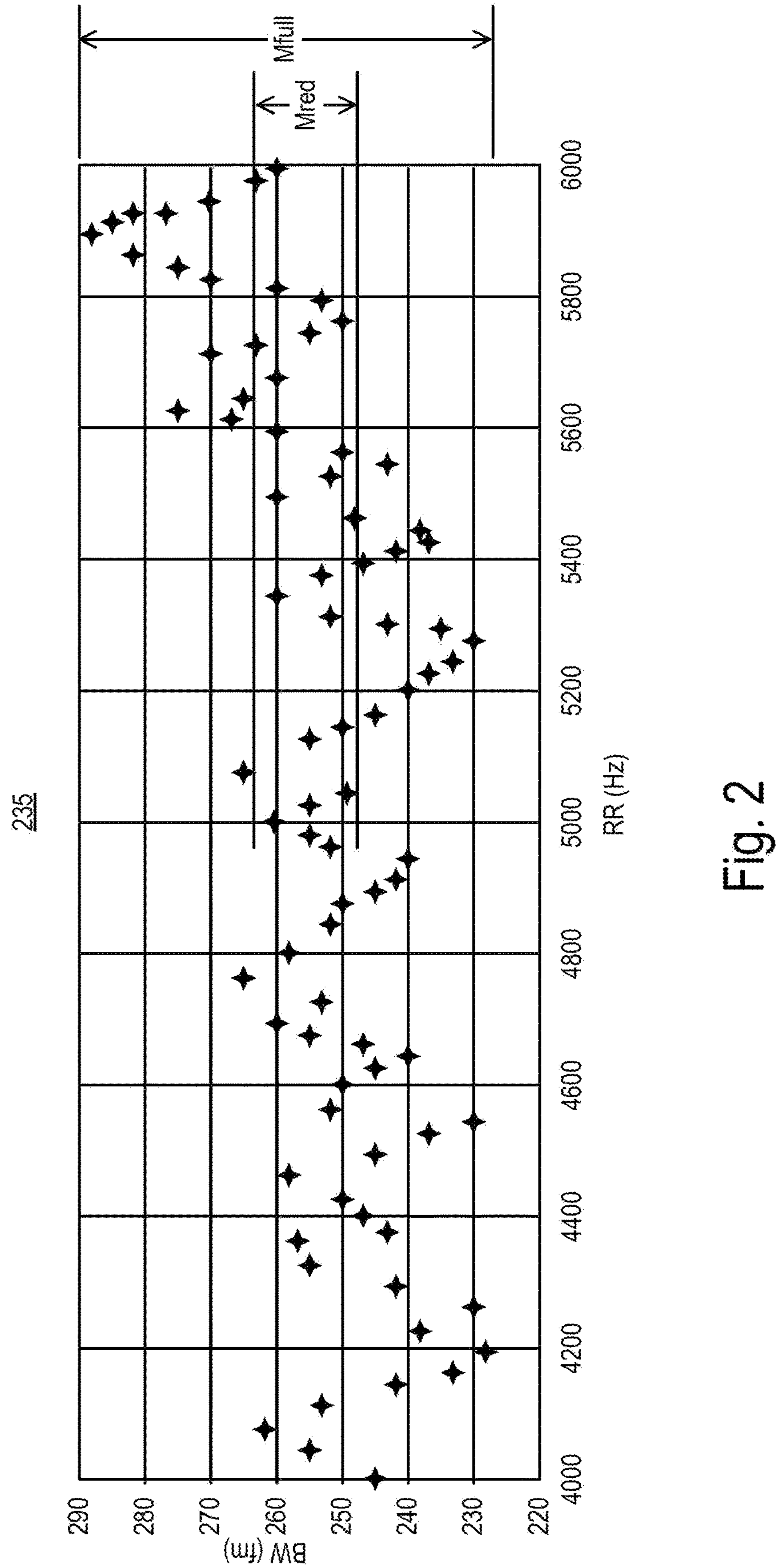
FIG. 2 is a graph of a performance specification of the pulsed light beam 130 is shown versus an actual firing pattern property (a pulse repetition rate RR in Hertz or Hz) of the pulsed light beam.

Referring to FIG. 2, a graph 235 of a performance specification (intrinsic bandwidth BW in femtometers or fm) of the pulsed light beam 130 is shown versus possible pulse repetition rates of a laser (RR in Hertz or Hz), which is an example of an actual firing pattern property of the pulsed light beam 130. In this example, the pulse repetition rate RR can have a value between 4000 Hz and 6000 Hz. Based on the intrinsic performance for the optical source 120, a bandwidth controller (which is a part of the control apparatus 129 within the optical source 120) must operate within a margin Mfull of approximately 60 fm in order to stabilize the bandwidth BW of the pulsed light beam 130 for operation between 4000-6000 Hz. This margin Mfull of 60 fm can be near an upper limit or even exceed an available margin for that bandwidth controller. This limited flexibility may cause bandwidth instability in the pulsed light beam 130 produced by the light source 121. If the actual firing pattern AFP that is defined in the trigger signal 160 requests a repetition rate of approximately 5000 Hz (and no other repetition rate), then it is evident from this graph 235 that at 5000 Hz, the intrinsic bandwidth will be in a range approximately between 250 fm and 260 fm, which corresponds to a reduced margin Mred of closer to 10 fm. Thus, if the prediction apparatus 100 provides advance notice to the optical source 120 that the upcoming actual firing pattern AFP will request a repetition rate of 5000 Hz, then the optical source 120 (specifically the control apparatus 129) can operate the bandwidth controller in the reduced margin Mred and still provide a stable bandwidth in the pulsed light beam 130 for the photolithography exposure apparatus 140. And, the optical source 120 can provide this stable bandwidth in the pulsed light beam 130 without any special or additional burden on the photolithography exposure apparatus 140. That is, the photolithography exposure apparatus 140 need not modify its actions. Nevertheless, the prediction apparatus 100 can use the identifier 142 to improve or optimize the performance of the optical source 120 in real time, during laser operation.

Another property of the actual firing pattern AFP is the duty cycle, which is related to the ratio between the duration of a pulse (or pulse width) and the period of the waveform of the pulsed light beam 130. In a full operating space, the optical source 120 assumes that the duty cycle can be any value up to 75%. Nevertheless, often, the actual firing pattern AFP requires a duty cycle in a range of 7-34%, which is a much smaller subset of the full permitted range of the duty cycle.

Referring again to FIG. 1A, the photolithography exposure apparatus 140 processes the substrate 141, which is received by a wafer holder or stage 143. The light beam 130 is a pulsed light beam that includes pulses 131 of light separated from each other in time. The pulses can be clustered in groups called bursts 132. For example, a few hundred pulses can be in a single burst. In between the bursts, no light is being produced. A single burst can process one particular area of the substrate 141. Moreover, a single substrate 141 can include 100-200 areas (and thus is able to receive 100-200 bursts of the pulsed light beam 130). The actual firing pattern AFP can indicate the RR of the pulses 131, the number of pulses 131 in one burst 132, a time interval between two bursts 132, and the duty cycle, for example. A particular actual firing pattern AFP can be applied to one substrate 141, or to more than one substrate 141. A "lot" refers to those one or more substrates 141 where each substrate 141 in a lot has the same or similar actual firing pattern AFP.

The photolithography exposure apparatus 140 includes a projection optical system 144 through which the light beam 130 passes prior to reaching the substrate 141, and a lithography controller 145. The photolithography exposure apparatus 140 can include other components not shown. The photolithography exposure apparatus 140 can be a liquid immersion system or a dry system. Microelectronic features are formed on the substrate 141 by, for example, exposing a layer of radiation-sensitive photoresist material on the substrate 141 with the light beam 130.

Referring also to FIG. 1B, in some implementations, such as for a light beam 130 in the DUV wavelength range the projection optical system 144 includes a slit 146, a mask 147, and a projection objective, which includes a lens 148. The light beam 130 enters the optical system 144 and impinges on the slit 146, and at least some of the beam 130 passes through the slit 146. In the example of FIGS. 1A and 1B, the slit 146 is rectangular and shapes the light beam 130 into an elongated rectangular shaped light beam. A pattern is formed on the mask 147, and the pattern determines which portions of the shaped light beam are transmitted by the mask 147 and which are blocked by the mask 147. The design of the pattern is determined by the specific microelectronic circuit design that is to be formed on the substrate 141. The shaped light beam interacts with the mask 147. The portions of the shaped light beam that are transmitted by the mask 147 pass through (and can be focused by) the projection lens 148 and expose the substrate 141. The portions of the shaped light beam that are transmitted by the mask 147 form an aerial image in the x-y plane in the substrate 141. The aerial image is the intensity pattern formed by the light that reaches the substrate 141 after interacting with the mask 147.

As mentioned above, the prediction apparatus 100 is configured to analyze the identifier 142 that is produced by the photolithography exposure apparatus 140, and provide the forecast firing pattern FFP 101 to the optical source 120. This works because the identifier 142 corresponds to a precise firing pattern that is similar for all substrates 141 associated with that same identifier 142. The identifier 142 for a lot (and thus all substrates 141 in that lot) is generated by the lithography controller 145 prior to the lithography controller 145 initially sending the trigger signal 160 to the optical source 120 for that identifier 142. The identifier 142 can correspond to the actual firing pattern AFP applied to a single lot (and thus all substrates 141 in the lot) of one or more substrates 141. For example, the lithography controller 145 can provide the identifier 142 to the prediction apparatus 100 at a time that is 0.1, 0.2, 0.5, 1, 2, 5, 10, 20, 30, 40, 50, 60, or more than 60 seconds prior to the lithography controller 145 sending the first trigger request in the trigger signal 160 corresponding to that identifier 142 to the optical source 120.

Figure 3:
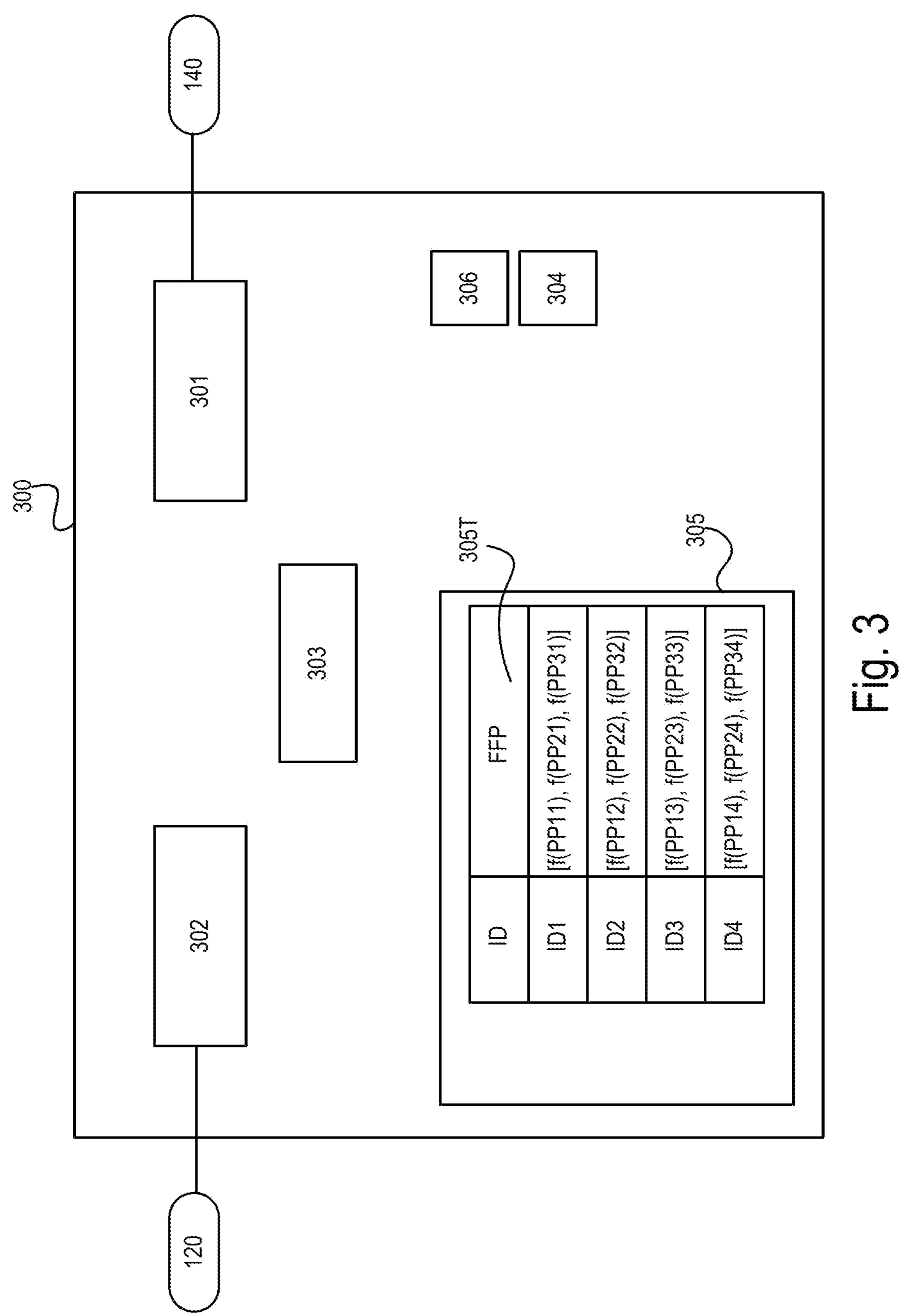
FIG. 3 is a block diagram of an implementation of the prediction apparatus of FIG. 1, the prediction apparatus including a photolithography module that is in communication with the photolithography exposure apparatus and an optical source module that is in communication with the optical source.

Referring to FIG. 3, an implementation 300 of the prediction apparatus 100 includes a photolithography module 301 that is in communication with the photolithography exposure apparatus 140 and an optical source module 302 that is in communication with the optical source 120. The photolithography module 301 is configured to receive, from the photolithography exposure apparatus 140, data that includes the identifier 142. The optical source module 302 is configured to provide the forecast firing pattern FFP 101 to the optical source 120. The optical source module 302 is also configured to determine the forecast firing pattern FFP 101 that is associated with the identifier 142 received at the photolithography module 301. The optical source module 302 makes the determination regarding the forecast firing pattern FFP 101 prior to it providing that forecast firing pattern FFP 101 to the optical source 120.

The prediction apparatus 300 can further include a forecast module 303 that is configured to create the forecast firing pattern based on the identifier 142. At various times, the forecast module 303 communicates with the photolithography module 301 and/or the optical source module 302. In particular, the forecast module 303 receives the identifier 142 from the photolithography module 301 and provides the forecast firing pattern FFP 101 to the optical source module 302.

The prediction apparatus 300 can also include a processor 304, electronic storage 305, and a separate input/output interface 306. Each of the modules 301, 302, 303 can be executed by the processor 304. The processor 304 includes one or more processors suitable for the execution of a computer program such as a general or special purpose microprocessor, and can be any of one or more processors of any kind of digital computer. Generally, an electronic processor receives instructions and data from a read-only memory, a random-access memory, or both. The electronic processor 304 can be any type of electronic processor. The electronic storage 305 can be volatile memory, such as RAM, or non-volatile memory. In some implementations, the electronic storage 305 includes non-volatile and volatile portions or components. The electronic storage 305 can store data and information that is used in the operation of the modules 301, 302, 303.

Moreover, the electronic storage 305 can store a set 305T of various forecast firing patterns FFP 101, with each stored forecast firing pattern FFP being associated with a unique identifier ID 142. Each forecast firing pattern FFP 101 is given by a set of one or more properties [f(PPki)], where k denotes the property and i denotes the ID. As mentioned above, the identifier 142 may be an alphanumeric string of characters IDi. As shown in FIG. 3, the electronic storage 305 stores a set of four forecast firing patterns FFP [f(PPki)], where k=1, 2, or 3 represents three pulse properties for each pattern, for four unique identifiers IDi, where i=1, 2, 3, or 4. For example, the first pulse property PP1i can be the repetition rate RR at which pulses of the light beam 130 are produced, the second pulse property PP2i can be the number of pulses Nop of the light beam 130 that are produced in a single burst of the light beam 130, and the third pulse property PP3i can be the time Tb between bursts of the light beam 130. The forecast module 303 can populate the set 305T as it creates each forecast firing pattern FFP (as discussed below). Moreover, the optical source module 302 can determine the forecast firing pattern FFP 101 that is uniquely associated with a received identifier 142 by accessing the set 305T from electronic storage 305, finding the ID that corresponds to a particular received identifier 142, and accessing the forecast firing pattern FFP [f(PPki)] associated with that ID.

The input/output interface 306 can be any kind of electronic interface that allows the prediction apparatus 300 to receive and/or provide data and signals with an operator, the optical source 120, the photolithography exposure apparatus 140, and/or an automated process running on another electronic device. For example, the input/output interface 306 can include one or more of a visual display, a keyboard, and a communications interface. The photolithography module 301 and the optical source module 302 can access or be a part of the input/output interface 306.

In some implementations, the prediction apparatus 100 is a stand-alone apparatus that is external to the optical source 120 and the photolithography exposure apparatus 140. In other implementations, the prediction apparatus 100 resides in or is a part of the optical source 120. For example, the components of the prediction apparatus 100 can be implemented within the control apparatus 129 of the optical source 120.

Figure 4:
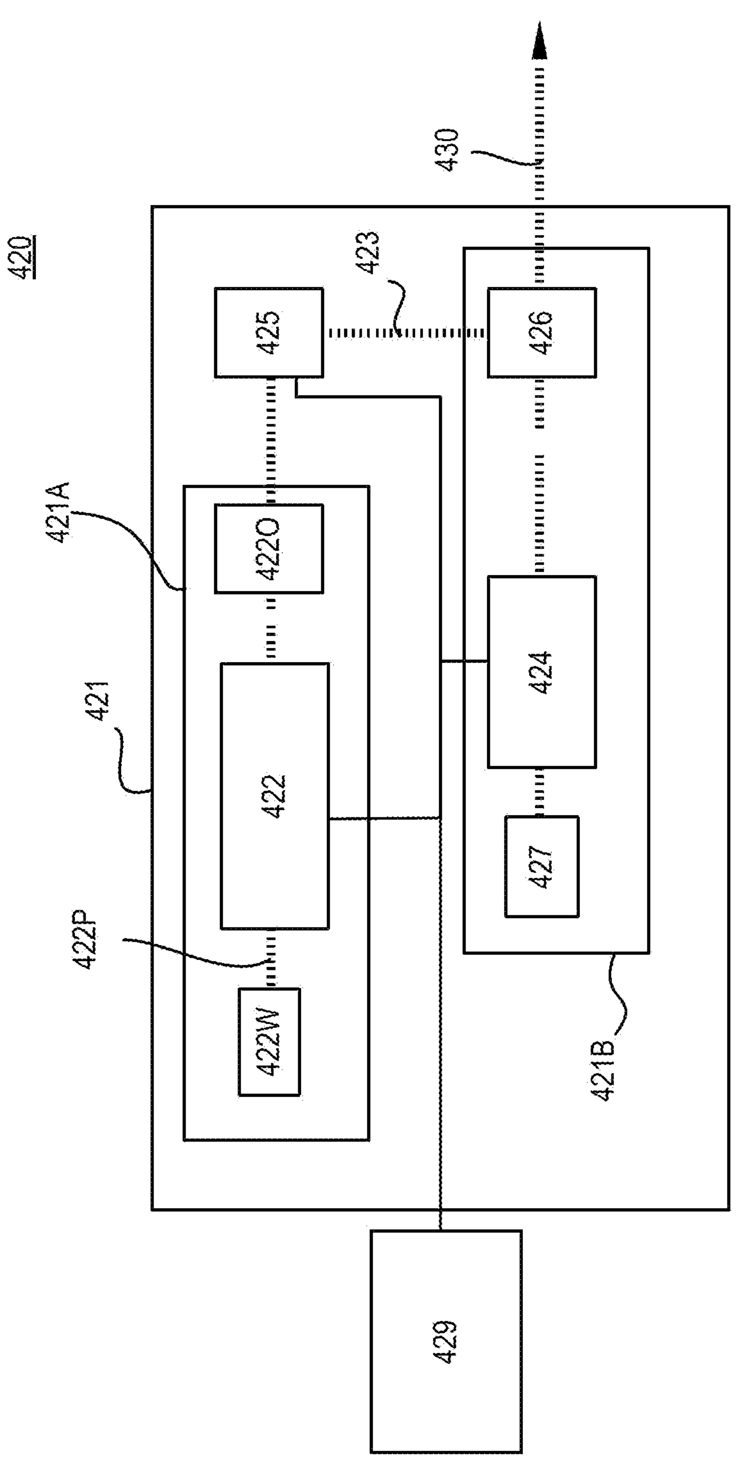
FIG. 4 is a block diagram of an implementation of the optical source of FIG. 1 that produces a pulsed light beam having a wavelength in the deep ultraviolet (DUV) range, the optical source being a two-stage laser system.

Referring to FIG. 4, an implementation 420 of the optical source 120 is shown in which the optical source 420 produces a pulsed light beam 430 having a wavelength in the deep ultraviolet (DUV) range. In this implementation, the optical source 420 includes a control apparatus 429 and a light source 421, and the light source 421 is a two-stage laser system that includes a first stage 421A and a second stage 421B. The first stage 421A includes a master oscillator (MO) 422 that provides a seed light beam 423 to a power amplifier (PA) 424 of the second stage 421B. The master oscillator 422 typically includes a gain medium in which amplification occurs and an optical feedback mechanism such as an optical resonator. The power amplifier 424 typically includes a gain medium in which amplification occurs when seeded with the seed laser beam 423 from the master oscillator 422. The second stage 421B can be a single-pass amplifier, a double-pass amplifier, a power ring amplifier (PRA), which is designed as a regenerative ring resonator, a power oscillator, or other form of optical amplifier.

The first stage 421A includes a spectral feature selection apparatus 422W that receives a light beam 422P from the master oscillator 422 to enable fine tuning of spectral features such as the center wavelength and the bandwidth of the light beam 422P (and therefore the pulsed light beam 430) at relatively low output pulse energies. The power amplifier 424 receives the seed light beam 423 from the master oscillator 422 and amplifies this output to attain the necessary power for output to use in photolithography. In some implementations, the master oscillator 422 includes a discharge chamber having two elongated electrodes, a laser gas that serves as the gain medium, and a fan circulating the gas between the electrodes. A laser resonator is formed between the spectral feature selection apparatus 422W on one side of the discharge chamber, and an output coupler 422O on a second side of the discharge chamber to output the seed light beam 423 to the power amplifier 424.

The optical source 420 can also include a metrology module 425 (such as a line center analysis module or LAM) that receives an output from the output coupler 422O, and one or more beam modification optical systems 426 that modify the size and/or shape of the beam as needed. The metrology module 425 is an example of type of measurement system that can be used to measure the wavelength (for example, the center wavelength) of the seed light beam 423.

The power amplifier 424 includes a power amplifier discharge chamber and may also include a beam reflector or beam turning device 427 that reflects the light beam back into the discharge chamber. The power amplifier discharge chamber includes a pair of elongated electrodes, a laser gas that serves as the gain medium, and a fan for circulating the gas between the electrodes. The seed light beam 423 is amplified by passing through the power amplifier 424. The beam modification optical system 426 provides a way to in-couple the seed light beam 423 to the power amplifier 424. The beam modification optical system 426 may also out-couple a portion of the amplified radiation from the power amplifier 424 to form the output pulsed light beam 430.

The repetition rate of the pulses produced by the power amplifier 421B can be determined by the repetition rate at which the master oscillator 421A is controlled by the control apparatus 129, under the instructions in the trigger signal 160 from the photolithography exposure apparatus 140. The repetition rate of the pulses output from the power amplifier 421B is the repetition rate seen by the photolithography exposure apparatus 140.

It is possible to control the bandwidth both coarsely and finely using only optical elements. On the other hand, it is possible to control the bandwidth in a fine and narrow range, and rapidly, by controlling a differential timing between the activation of the electrodes within the master oscillator 421A and the power amplifier 421B while controlling the bandwidth in a coarse and wide range by adjusting the angle of a prism within the spectral feature selection system 422W.

The gas mixture used in the discharge chambers of the master oscillator 421A and the power amplifier 421B can be any gas suitable for producing a light beam at the wavelength and bandwidth required for the application. For an excimer source, the gas mixture can contain a noble gas (rare gas) such as, for example, argon or krypton, a halogen, such as, for example, fluorine or chlorine and traces of xenon and a buffer gas, such as helium. Specific examples of the gas mixture include argon fluoride (ArF), which emits light at a wavelength of about 193 nm, krypton fluoride (KrF), which emits light at a wavelength of about 248 nm, or xenon chloride (XeCl), which emits light at a wavelength of about 351 nm. The excimer gain medium (the gas mixture) is pumped with short (for example, nanosecond) current pulses in a high-voltage electric discharge by application of a voltage to the elongated electrodes within the respective discharge chambers of the master oscillator 421A and the power amplifier 421B.

In other implementations, the optical source 120 can produce a pulsed light beam 130 having a wavelength in the extreme ultraviolet (EUV) range. In these implementations, the optical source 120 includes a vacuum chamber that defines a target space at which a target (in a train of traveling targets) interacts with one or more operational light beams to produce a plasma that emits the EUV light. The EUV optical source also includes an EUV light collector (such as a mirror) arranged relative to the target space, the EUV light collector collecting this emitted EUV light and redirecting that collected EUV light as an EUV light beam toward the photolithography exposure apparatus 140. Each target can be, for example, a droplet of liquid or molten metal, a portion of a liquid stream, solid particles or clusters, solid particles contained within liquid droplets, a foam of target material, or solid particles contained within a portion of a liquid stream. Each target can include, for example, water, tin, lithium, xenon, or any material that, when converted to a plasma state, has an emission line in the EUV range. The photolithography exposure apparatus 140 can be configured to operate on EUV light.

Figure 5:
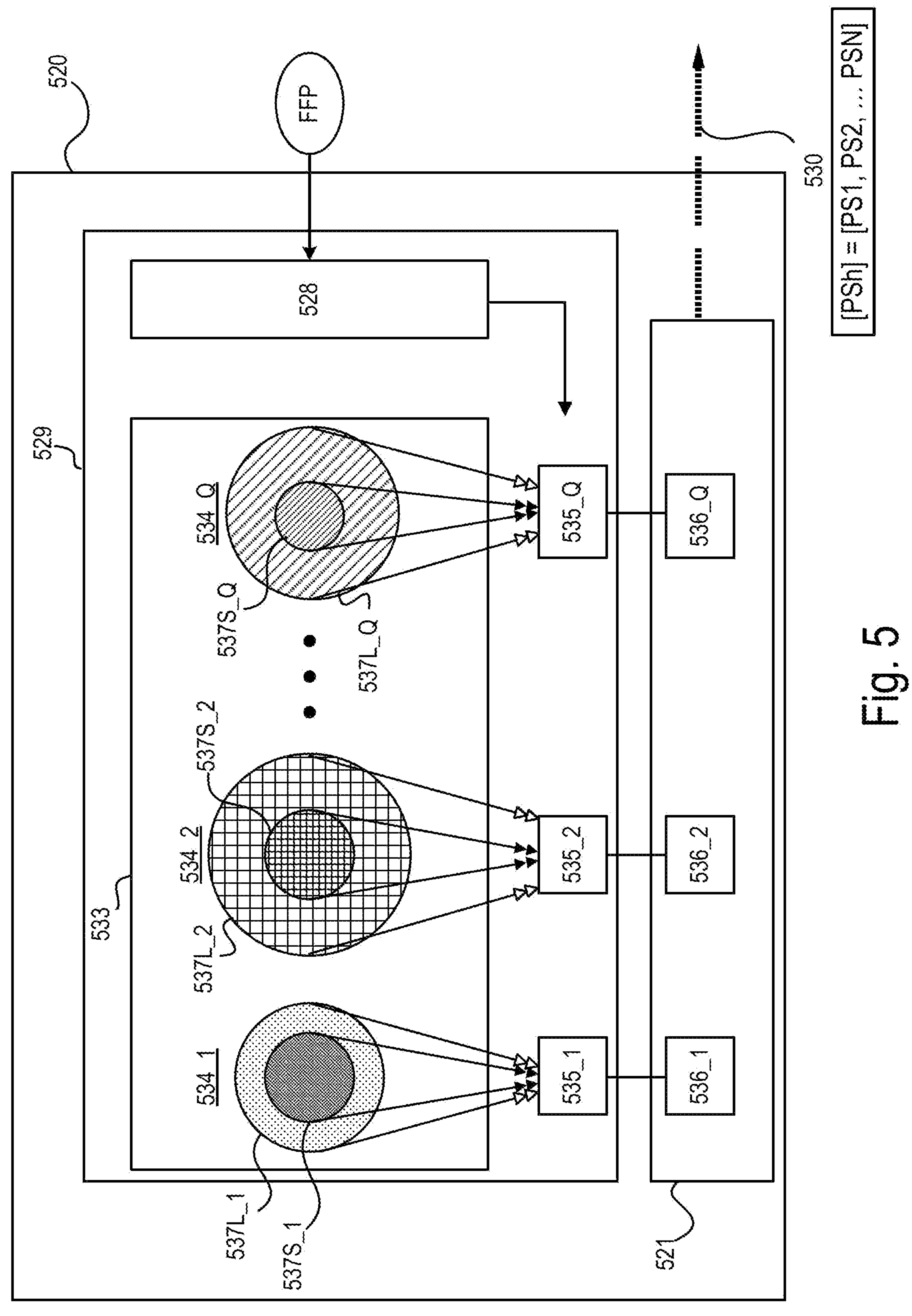
FIG. 5 is a block diagram of an implementation of the optical source of FIG. 1 that includes a light source that produces the pulsed light beam, and a control apparatus including an operating module that is configured to receive a forecast firing pattern from the prediction apparatus.

Referring to FIG. 5, an implementation 520 of the optical source 120 includes a control apparatus 529 and a light source 521 that produces a pulsed light beam 530. The pulsed light beam 530 includes bursts of pulses, with each pulse being defined by a set of performance specifications [PSh], where h denotes a number of performance specifications and can be greater than or equal to 1. The control apparatus 529 includes an operating module 528 that is configured to receive the forecast firing pattern FPP 101 from the prediction apparatus 100. The control apparatus 529 operates within an operating space 533, the operating space 533 defined by a set of operating response parameters

534_*i*, where i is an integer that is greater than or equal to 1. Each set of operating response parameters 534_*i* defines those operating response parameters within which an associated respective control module 535_*i* is expected to operate. The operating response parameter of a particular control apparatus indicates a level of response output from the control apparatus for a particular input. Examples of operating response parameters include a range, margin, or a gain within which the control apparatus operates. Each control module 535_*i* is configured to control operation of one aspect of the light source 521 by way of a respective actuator 536_*i*.

For example, one of the control modules 535_1 can be a spectral feature control module configured to control operation of one or more of the optical oscillators and optical amplifiers of the optical source 120, and can be specifically designed to control a spectral feature (such as a wavelength or a bandwidth) of the pulsed light beam 130. Another of the control modules 535_2 can be an energy control module configured to control operation of one or more of the oscillators and optical amplifiers of the optical source 120, and can be specifically designed to control an energy of the pulsed light beam 130. The wavelength, bandwidth, and energy of the pulsed light beam 130 can be considered stable performance specifications defined by the photolithography exposure apparatus 140.

Without the advance notice of the forecast firing pattern FFP from the prediction apparatus 100, the operating module 528 determines that each control module 535_*i* of the control apparatus 529 should operate using a full operating space, which means that the values of the operating response parameters 534_*i* are maximally used and this is represented by the larger circles 537L_i. On the other hand, if the prediction apparatus 100 provides the forecast firing pattern FFP to the operating module 528, then the operating module 528 can instruct one or more of the control modules 535_*i* to operate using a reduced operating space. In this case, at least some of the values of the operating response parameters 534_*i* are narrowed or reduced, and this is represented by the smaller circles 537S_i.

Figure 6:
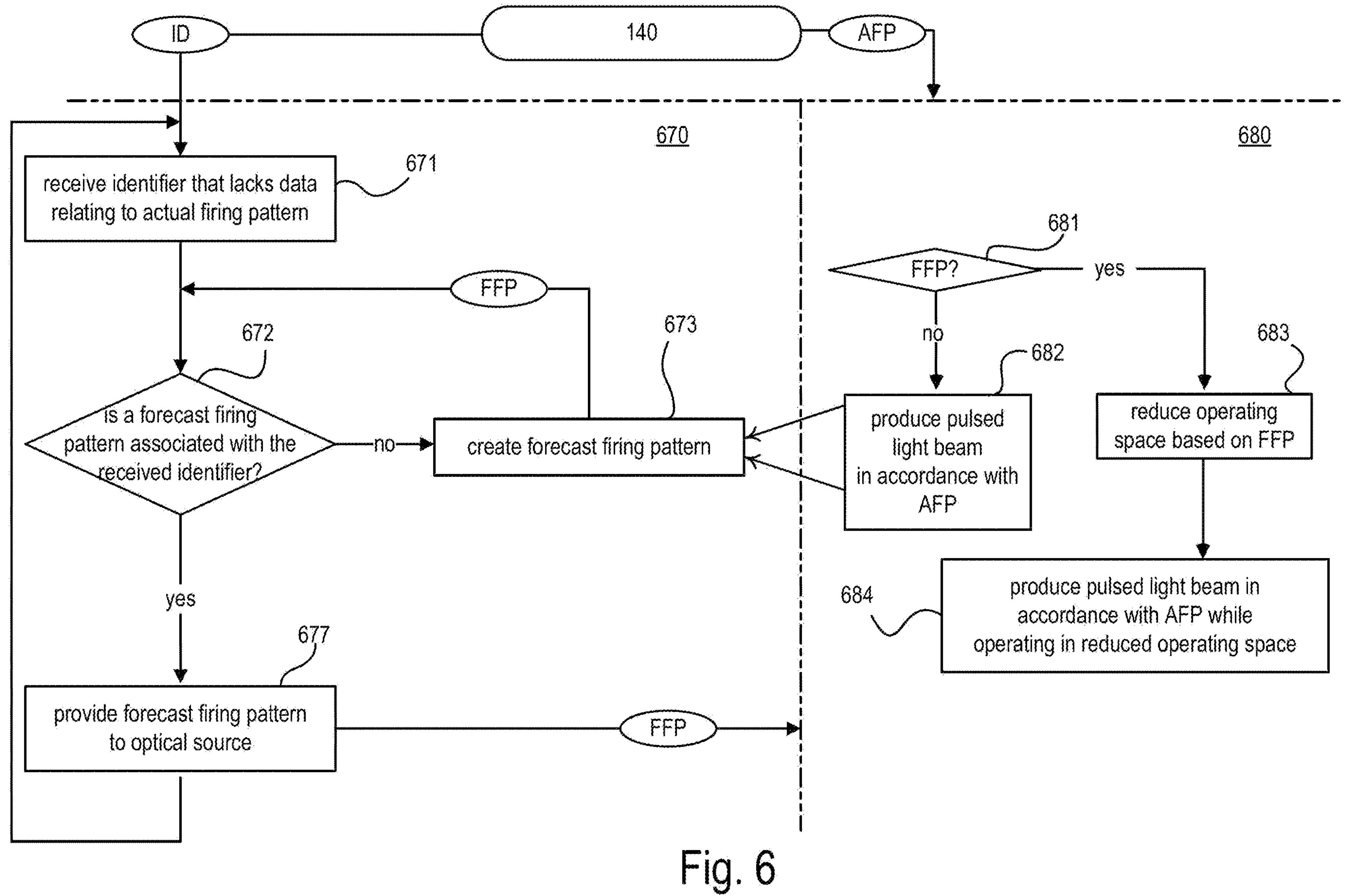
FIG. 6 is a flow chart of a procedure performed by the prediction apparatus of FIG. 1 for operating the optical source in accordance with a reduced operating space relative to a full permitted operating space based on the forecast firing pattern, the procedure being performed in parallel with a procedure performed by the operating source.
Figure 8A:
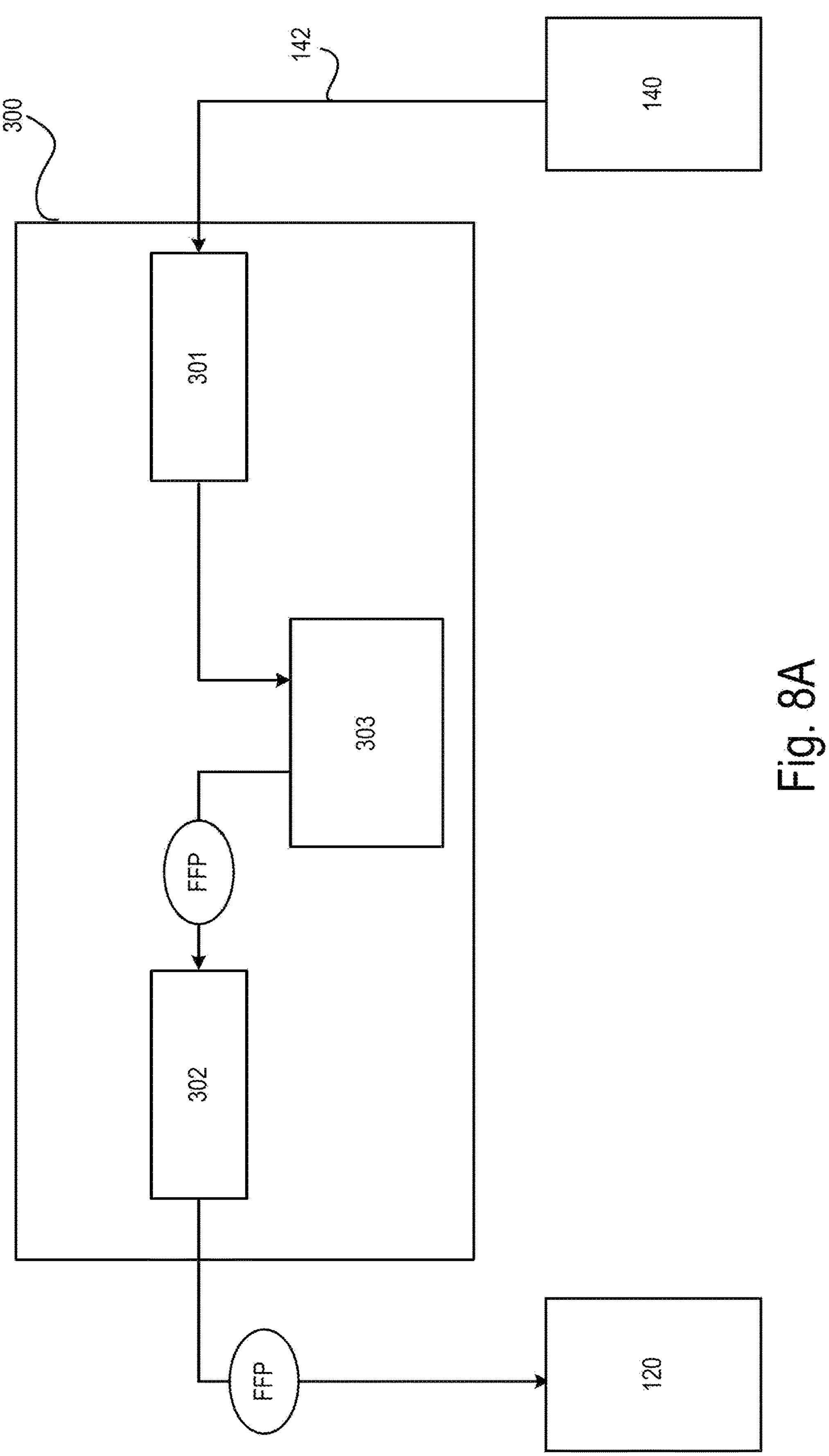
FIG. 8A is a block diagram of the prediction apparatus of FIG. 1, showing steps 671, 672, and 677 of the procedure of FIG. 6 relative to the optical source and the photolithography exposure apparatus.
Figure 8B:
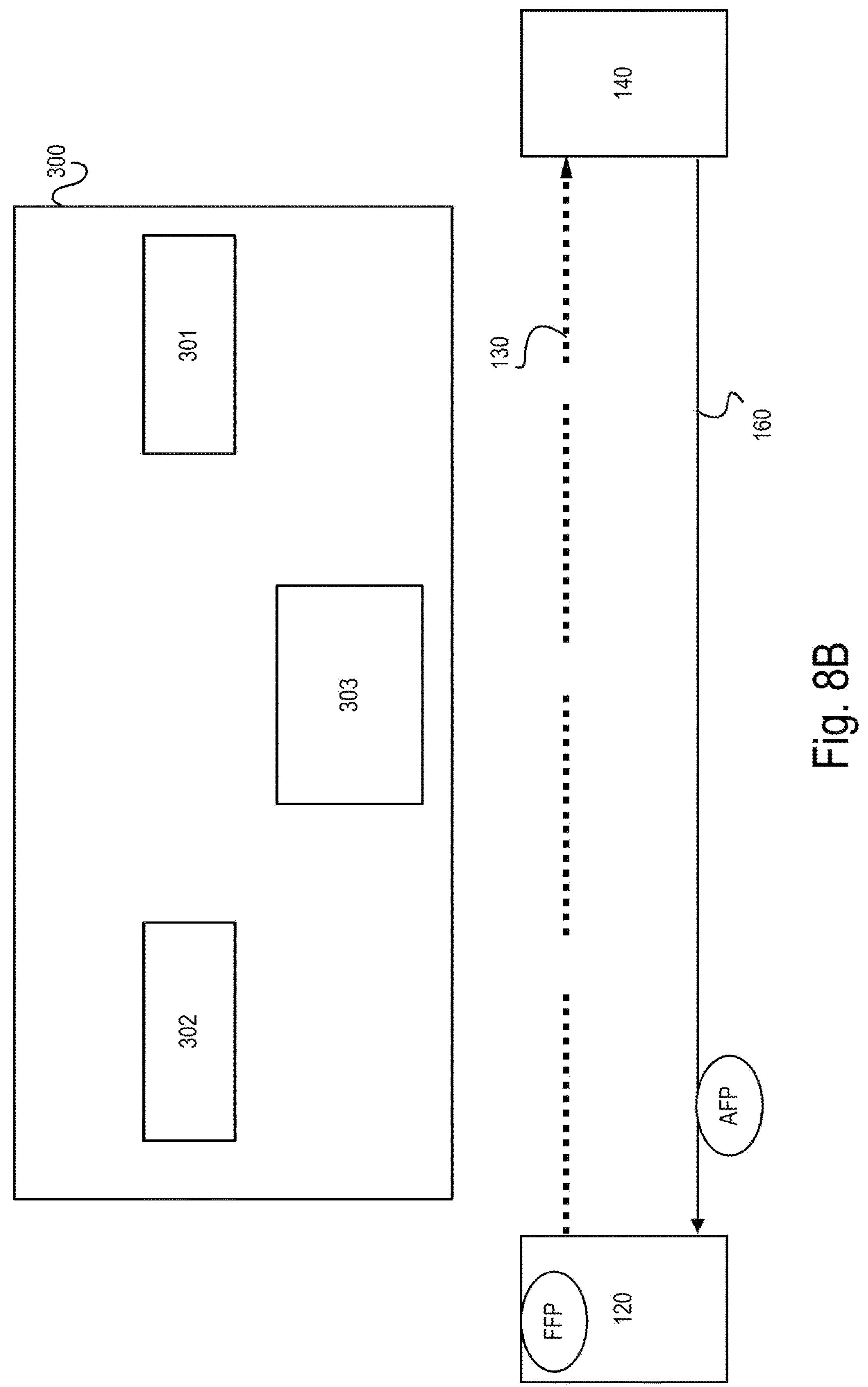
FIG. 8B is a block diagram of the prediction apparatus of FIG. 1, showing steps 683 and 684 of the procedure of FIG. 6 relative to the optical source and the photolithography exposure apparatus.
Figure 8C:
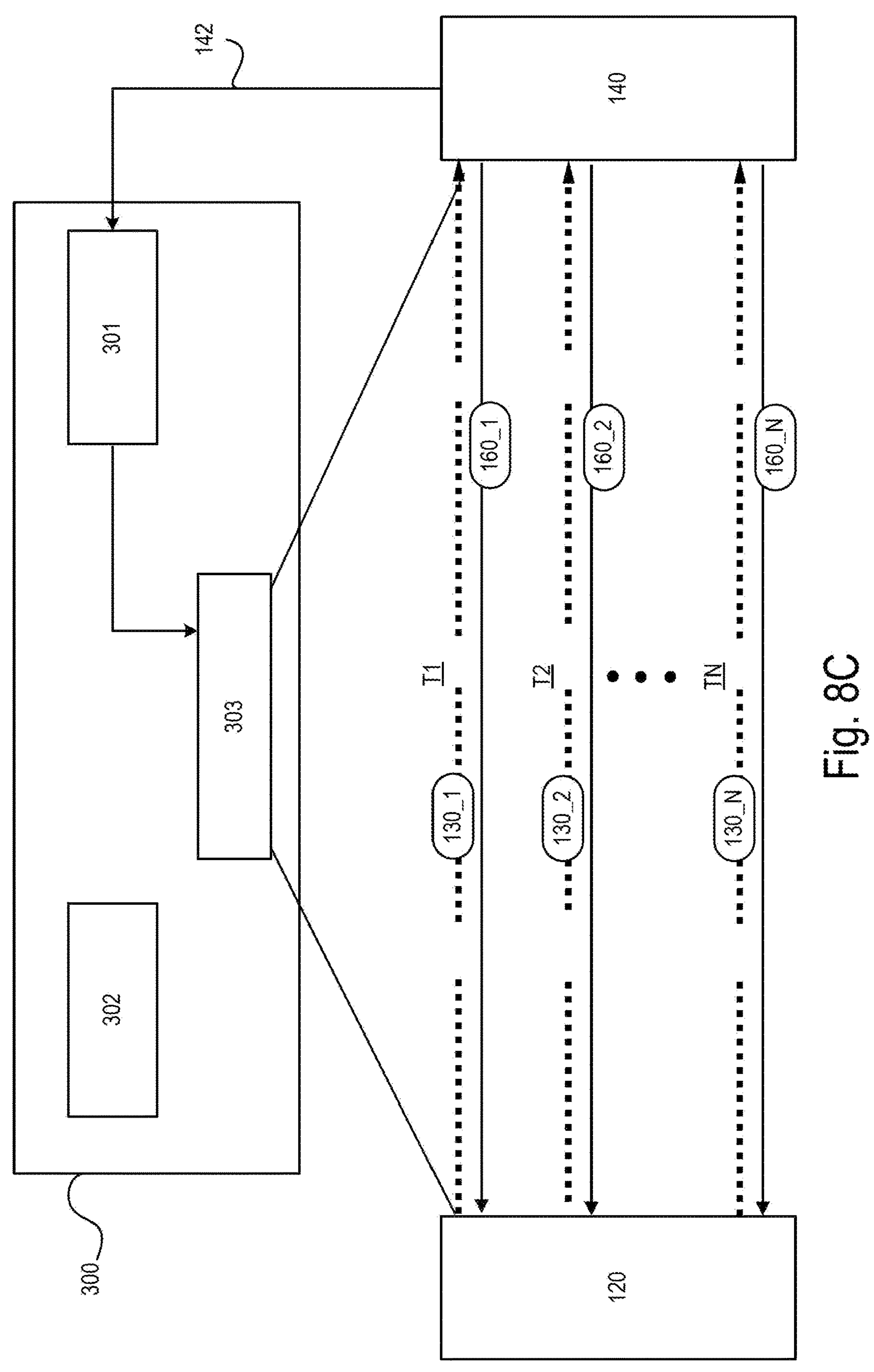
FIG. 8C is a block diagram of the prediction apparatus of FIG. 1, showing the steps of the procedure of FIG. 7 for creating the forecast firing pattern once the identifier is received from the photolithography module.

Referring to FIG. 6, the prediction apparatus 100 performs a procedure 670 for operating the optical source 120 in accordance with a reduced operating space relative to a full permitted operating space. The operating source 120 performs a procedure 680 in parallel with the procedure 670. Reference is also made to FIGS. 8A-8C when discussing the procedure 670.

The procedure 670 starts when the prediction apparatus 100 receives the identifier ID (671) from the photolithography exposure apparatus 140. For example, the photolithography module 301 can receive the identifier ID (671). As discussed above, the identifier ID lacks data relating to an actual firing pattern AFP that defines properties of the pulsed light beam 130. The prediction apparatus 100 receives the identifier ID prior to the photolithography exposure apparatus 140 providing the actual firing pattern AFP to the optical source 120 (by way of the trigger signal 160). The photolithography module 301 may be configured to respond to only a single ID from the photolithography exposure apparatus 140 at any one moment in time. For example, the photolithography exposure apparatus 140 may be configured to transmit, signal, or announce one ID at a time, and not a plurality of IDs at any one moment in time. However, the photolithography exposure apparatus 140 may be configured to send distinct IDs at different times, depending on the substrate 141 and/or lot that is being processed. Alternatively, the photolithography module 301 may be configured to respond to a combination of multiple IDs from the photolithography exposure apparatus 140 at any one moment in time, and to ascertain a single forecast firing pattern FFP from the combination of IDs.

The prediction apparatus 100 determines whether a forecast firing pattern is already associated with the received ID (672). For example, the photolithography module 301 can determine whether a forecast firing pattern FFP is associated with the received ID by accessing the data within the set 305T stored within electronic storage 305.

If the prediction apparatus 100 determines that a forecast firing pattern FFP is not associated with the received ID (672), then this means that a forecast firing pattern FFP has not yet been created for this new ID. The prediction apparatus 100 may be configured to create the forecast firing pattern FFP for the received new ID (673). For example, the photolithography module 301 can instruct the forecast module 303 to perform a procedure 673 for creating the forecast firing pattern FFP for the received ID. In this way, the prediction apparatus 100 learns and deduces the forecast firing pattern FFP correlated with the received ID.

If the prediction apparatus 100 determines that a forecast firing pattern FFP is associated with the received ID (672), then the prediction apparatus 100 provides this forecast firing pattern FFP to the optical source 120 (677). For example, the photolithography module 301 can provide the forecast firing pattern FFP associated with the received ID (which was accessed from the data within the set 305T stored within electronic storage 305) to the optical source module 302, and the optical source module 302 provides the forecast firing pattern FFP to the optical source 120. Steps 671, 672, and 677 are also depicted in FIG. 8A.

Eventually, the optical source 120 receives the actual firing pattern AFP from the photolithography exposure apparatus 140. This happens when the first trigger request in the trigger signal 160 is received at the optical source 120. At this moment, the optical source 120 determines whether the prediction apparatus 100 has provided the forecast firing pattern FFP prior to receipt of this first trigger request (681). If the optical source 120 determines that the forecast firing pattern FFP has not yet been provided from the prediction apparatus 100 (681), then the optical source 120 begins producing the pulsed light beam 130 in accordance with the actual firing pattern AFP (682). For example, in this case, and with reference to FIG. 5, without the advance notice of the forecast firing pattern FFP from the prediction apparatus 100, the operating module 528 determines that each control module 535_*i* of the control apparatus 529 should operate using a full operating space, which means that the values of the operating response parameters 534_*i* are maximally used.

If the optical source 120 determines that the forecast firing pattern FFP has been provided from the prediction apparatus 100 (681), then the optical source 120 reduces its operating space based on the provided forecast firing pattern FFP (683) and then begins producing the pulsed light beam 130 in accordance with the actual firing pattern AFP while operating in the reduced operating space (684). For example, in this case, and with reference to FIG. 5, the prediction apparatus 100 provides the forecast firing pattern FFP to the operating module 528, and the operating module 528 instructs one or more of the control modules 535_*i* to operate using a reduced operating space. At least some of the values of the operating response parameters 534_*i* are narrowed or reduced. Steps 683 and 684 are also depicted in FIG. 8B.

The prediction apparatus 100 provides the forecast firing pattern FFP to the optical source 120 (677) prior to the optical source 120 determining whether the forecast firing pattern FFP has been received (681) and also prior to the optical source 120 receiving the first trigger request in the trigger signal 160 for the actual firing pattern AFP. This enables the optical source 120 to have enough time to make the adjustments required to reduce its operating space at 683 prior to the optical source 120 needing to produce the pulsed light beam 130 (684).

Figure 7:
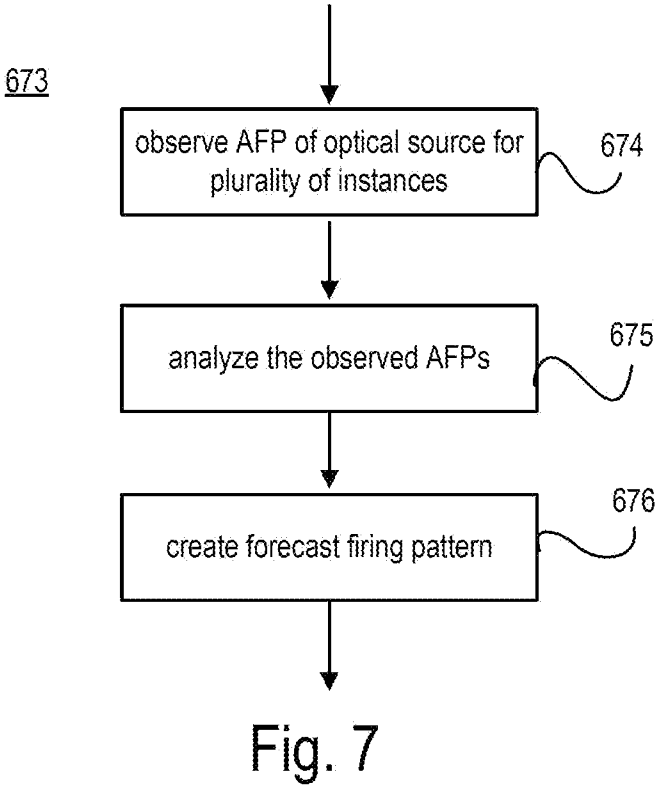
FIG. 7 is a flow chart of a procedure performed by the prediction apparatus of FIG. 1 for creating the forecast firing pattern once the prediction apparatus receives the identifier.

FIG. 7 shows one implementation of the procedure 673 for creating a new forecast firing pattern FFP after the forecast module 303 receives a new, unfamiliar ID from the photolithography module 301. The procedure 673 is also depicted in FIG. 8C. The forecast module 303 observes an actual firing pattern AFP of the optical source 120 a plurality of instances (denoted by T1, T2, . . . . TN) after receipt of the ID (674). While each instance T1, T2, . . . . TN is depicted in FIG. 8C, these instances do not occur at the same time; rather, these instances occur at distinct times, which are denoted by T1, T2, . . . . TN. The number N of instances that the forecast module 303 observes can be a plural number that enables the forecast module 303 to reliably build the forecast firing pattern FFP. The forecast module 303 analyzes these observed actual firing patterns AFP of the optical source 120 (675). In particular, for this analysis (675), the forecast module 303 can determine components (for example, the pulse properties PPi) of the actual firing pattern AFP that are similar across all observed actual firing patterns AFP associated with a particular new ID. The forecast module 303 creates the forecast firing pattern FFP from these determined components (676). The forecast module 303 can populate a stored set of forecast firing patterns FFP 101 (for example, set 305T in FIG. 3) as each forecast firing pattern FFP is newly created. A component is similar across all observed actual firing patterns AFP (675) if the components are identical to each other or, there are no noticeable differences at the substrate 141 due to any differences in these components.

The implementations and/or embodiments can be further described using the following clauses:

1. A prediction apparatus in communication with an optical source configured to produce a pulsed light beam for use by a photolithography exposure apparatus, the prediction apparatus comprising:
   - a photolithography module in communication with the photolithography exposure apparatus and configured to receive an identifier, the received identifier lacking data relating to an actual firing pattern defining properties of the pulsed light beam; and
   - an optical source module in communication with the optical source, the optical source module configured to provide a forecast firing pattern to the optical source;
   - wherein the forecast firing pattern is associated with and determined from the received identifier, and forecasts a property of the actual firing pattern.

2. The prediction apparatus of clause 1, wherein the optical source module is configured to determine the forecast firing pattern that is associated with the received identifier prior to providing the forecast firing pattern to the optical source.

3. The prediction apparatus of clause 1, further comprising a forecast module configured to create the forecast firing pattern associated with the received identifier.

4. The prediction apparatus of clause 3, wherein the forecast module being configured to create the forecast pattern comprises observing the actual firing pattern of the optical source a plurality of instances after receipt of the identifier.

5. The prediction apparatus of clause 1, wherein the forecast firing pattern improves stability of the optical source in accordance with a reduced operating space while producing the pulsed light beam in accordance with a set of stable performance specifications defined by the photolithography exposure apparatus.

6. The prediction apparatus of clause 5, wherein the reduced operating space corresponds to an operating space that is less than the full permitted operating space of the optical source for controlling the full extent of disturbances to provide the stable performance specifications.

7. The prediction apparatus of clause 5, wherein the stable performance specifications defined by the photolithography exposure apparatus include an energy of the pulsed light beam and one or more spectral features of the pulsed light beam.

8. The prediction apparatus of clause 1, wherein the optical source module is in communication with one or more control modules within the optical source that are configured to enable operation of the optical source in accordance with the reduced operating space.

9. The prediction apparatus of clause 8, wherein the one or more control modules within the optical source are configured to control operation of one or more optical oscillators and optical amplifiers of the optical source.

10. The prediction apparatus of clause 9, wherein the one or more control modules within the optical source are configured to control operation of the one or more optical oscillators and optical amplifiers of the optical source based on a reduced operating space that is determined by the forecast firing pattern.

11. The prediction apparatus of clause 10, wherein the one or more control modules include: an energy control module configured to control an energy of the pulsed light beam; and a spectral feature control module configured to control a spectral feature of the pulsed light beam.

12. The prediction apparatus of clause 1, wherein the received identifier corresponds to the actual firing pattern applied to a single lot of one or more substrates positioned in the photolithography exposure apparatus, the one or more substrates being configured to receive the pulsed light beam.

13. The prediction apparatus of clause 1, wherein the forecast firing pattern that predicts the property of the actual firing pattern for the associated received identifier indicates one or more of: the number of pulses of the pulsed light beam per burst, a repetition rate of the pulses within a burst, and an inter-burst time interval.

14. The prediction apparatus of clause 1, wherein the photolithography module is configured to receive the identifier prior to the optical source producing the pulsed light beam in accordance with the actual firing pattern.

15. The prediction apparatus of clause 1, wherein, at any one moment in time, the photolithography module is configured to receive a single identifier and to provide a forecast firing pattern that is associated with that single received identifier to the optical source.

16. The prediction apparatus of clause 15, wherein, over time, the photolithography module is configured to receive a plurality of distinct identifiers and to provide a forecast firing pattern that is associated with each received identifier to the optical source.

17. The prediction apparatus of clause 1, wherein the optical source module being configured to provide the forecast firing pattern to the optical source to enable the optical source to produce the pulsed light beam in accordance with the actual firing pattern comprises providing the forecast firing pattern to the optical source in advance of the optical source receiving a request to operate based on the actual firing pattern.

18. The prediction apparatus of clause 1, wherein the received identifier is an alphanumeric string of characters not suitable for input to the optical source.

19. The prediction apparatus of clause 1, wherein the forecast firing pattern provided to the optical source improves stability in the pulsed light beam produced by the optical source in accordance with the actual firing pattern.

20. The prediction apparatus of clause 1, wherein the photolithography module is configured to receive the identifier from the photolithography exposure apparatus.

21. The prediction apparatus of clause 1, wherein the identifier is generated by the photolithography exposure apparatus.

22. The prediction apparatus of clause 1, wherein the property comprises the actual firing pattern.

23. The prediction apparatus of clause 1, wherein the property comprises a repetition rate of the actual firing pattern.

24. The prediction apparatus of clause 1, wherein the property comprise a reduced operating space of a control module within the optical source.

25. An ultraviolet (UV) light source comprising:

a photolithography exposure apparatus configured to receive a substrate;

an optical source configured to produce a pulsed light beam having a UV wavelength for use by the photolithography exposure apparatus to process the substrate; and a prediction apparatus in communication with the optical source and the photolithography exposure apparatus, the prediction apparatus configured to:

receive an identifier, the received identifier lacking data relating to an actual firing pattern defining properties of the pulsed light beam; and provide a forecast firing pattern associated with the received identifier to the optical source, the forecast firing pattern forecasting a property of the actual firing pattern.

26. The UV light source of clause 25, wherein the pulsed light beam has a wavelength in the deep UV range.

27. The UV light source of clause 25, wherein the pulsed light beam has a wavelength in the extreme UV range.

28. The UV light source of clause 25, wherein the forecast firing pattern provided to the optical source improves stability in the pulsed light beam produced by the optical source in accordance with the actual firing pattern.

29. The UV light source of clause 25, wherein the prediction apparatus resides in the optical source.

30. The UV light source of clause 25, wherein the prediction apparatus is external to the optical source.

31. A prediction apparatus in communication with an optical source configured to produce a pulsed light beam for use by a photolithography exposure apparatus, the prediction apparatus comprising:

a photolithography module in communication with the photolithography exposure apparatus and configured to receive an identifier, the received identifier lacking data relating to an actual firing pattern defining properties of the pulsed light beam;

a forecast module in communication with the photolithography module and configured to create a forecast firing pattern associated with the received identifier by observing an actual firing pattern of the optical source a plurality of instances after receipt of the identifier; and an optical source module in communication with the optical source, the optical source module configured to provide the forecast firing pattern to the optical source.

32. The prediction apparatus of clause 31, wherein the forecast module is configured to create the forecast firing pattern including analyzing the observed actual firing patterns of the optical source to determine components of the actual firing pattern that are similar across all observed actual firing patterns, and creating the forecast firing pattern from the determined components.

33. The prediction apparatus of clause 32, wherein components of the actual firing pattern are similar across all observed actual firing patterns if there are no noticeable differences at the substrate due to any differences in the components.

34. A method for operating an optical source in accordance with a reduced operating space relative to a full permitted operating space, the operating space for controlling the full extent of disturbances to provide stable performance specifications to a photolithography exposure apparatus, the method comprising:

receiving an identifier, the received identifier lacking data relating to an actual firing pattern defining properties of the pulsed light beam; and providing a forecast firing pattern to the optical source;

wherein the forecast firing pattern is associated with the received identifier and forecasts the actual firing pattern.

35. The method of clause 34, further comprising, prior to providing the forecast firing pattern to the optical source, determining whether a forecast firing pattern has been created.

36. The method of clause 35, wherein providing the forecast firing pattern to the optical source comprises providing the forecast firing pattern to the optical source only after the forecast firing pattern has been created.

37. The method of clause 35, further comprising creating the forecast firing pattern if it is determined that the forecast firing pattern has not yet been created.

38. The method of clause 37, wherein creating the forecast firing pattern comprises:

observing an actual firing pattern of the optical source a plurality of instances after receipt of the identifier;

analyzing the observed actual firing patterns of the optical source to determine components of the actual firing pattern that are similar across all observed actual firing patterns; and creating the forecast firing pattern from the determined components.

39. The method of clause 38, wherein components of the actual firing pattern are similar across all observed actual firing patterns if there are no noticeable differences at the substrate due to any differences in the components.

40. The method of clause 34, wherein receiving the identifier comprises receiving the identifier from the photolithography exposure apparatus prior to the optical source producing the pulsed light beam in accordance with the actual firing pattern.

41. The method of clause 34, wherein the forecast firing pattern is uniquely associated with the received identifier.

Other implementations are within the scope of the claims.

The invention claimed is:

1. A prediction apparatus in communication with an optical source configured to produce a pulsed light beam for use by a photolithography exposure apparatus, the prediction apparatus comprising:

a photolithography module in communication with the photolithography exposure apparatus and configured to receive an identifier, the received identifier lacking data relating to an actual firing pattern defining properties of the pulsed light beam; and an optical source module in communication with the optical source, the optical source module configured to provide a forecast firing pattern to the optical source;

wherein the forecast firing pattern is associated with and determined from the received identifier, and forecasts a property of the actual firing pattern.

2. The prediction apparatus of claim 1, wherein the optical source module is configured to determine the forecast firing pattern that is associated with the received identifier prior to providing the forecast firing pattern to the optical source.

3. The prediction apparatus of claim 1, further comprising a forecast module configured to create the forecast firing pattern associated with the received identifier.

4. The prediction apparatus of claim 3, wherein the forecast module being configured to create the forecast pattern comprises observing the actual firing pattern of the optical source a plurality of instances after receipt of the identifier.

5. The prediction apparatus of claim 1, wherein the forecast firing pattern improves stability of the optical source in accordance with a reduced operating space while producing the pulsed light beam in accordance with a set of stable performance specifications defined by the photolithography exposure apparatus and wherein the reduced operating space corresponds to an operating space that is less than the full permitted operating space of the optical source for controlling the full extent of disturbances to provide the stable performance specifications.

6. The prediction apparatus of claim 5, wherein the optical source module is in communication with one or more control modules within the optical source that are configured to enable operation of the optical source in accordance with the reduced operating space and the one or more control modules within the optical source are configured to control operation of one or more optical oscillators and optical amplifiers of the optical source.

7. The prediction apparatus of claim 6, wherein the reduced operating space is determined by the forecast firing pattern.

8. The prediction apparatus of claim 1, wherein the received identifier corresponds to the actual firing pattern applied to a single lot of one or more substrates positioned in the photolithography exposure apparatus, the one or more substrates being configured to receive the pulsed light beam.

9. The prediction apparatus of claim 1, wherein the forecast firing pattern that predicts the property of the actual firing pattern for the associated received identifier indicates one or more of: the number of pulses of the pulsed light beam per burst, a repetition rate of the pulses within a burst, and an inter-burst time interval.

10. The prediction apparatus of claim 1, wherein the optical source module being configured to provide the forecast firing pattern to the optical source to enable the optical source to produce the pulsed light beam in accordance with the actual firing pattern comprises providing the forecast firing pattern to the optical source in advance of the optical source receiving a request to operate based on the actual firing pattern.

11. The prediction apparatus of claim 1, wherein the received identifier is an alphanumeric string of characters not suitable for input to the optical source.

12. The prediction apparatus of claim 1, wherein the identifier is generated by the photolithography exposure apparatus.

13. The prediction apparatus of claim 1, wherein the property comprises a repetition rate of the actual firing pattern.

14. The prediction apparatus of claim 1, wherein the property comprises a reduced operating space of a control module within the optical source.

15. The prediction apparatus of claim 1, wherein the photolithography module is configured to receive the identifier from the photolithography exposure apparatus.

16. An ultraviolet (UV) light source comprising:

a photolithography exposure apparatus configured to receive a substrate;

an optical source configured to produce a pulsed light beam having a UV wavelength for use by the photolithography exposure apparatus to process the substrate; and a prediction apparatus in communication with the optical source and the photolithography exposure apparatus, the prediction apparatus configured to:

receive an identifier, the received identifier lacking data relating to an actual firing pattern defining properties of the pulsed light beam; and provide a forecast firing pattern associated with the received identifier to the optical source, the forecast firing pattern forecasting a property of the actual firing pattern.

17. The UV light source of claim 16, wherein the pulsed light beam has a wavelength in the deep UV range.

18. The UV light source of claim 16, wherein the pulsed light beam has a wavelength in the extreme UV range.

19. A prediction apparatus in communication with an optical source configured to produce a pulsed light beam for use by a photolithography exposure apparatus, the prediction apparatus comprising:

a photolithography module in communication with the photolithography exposure apparatus and configured to receive an identifier, the received identifier lacking data relating to an actual firing pattern defining properties of the pulsed light beam;

a forecast module in communication with the photolithography module and configured to create a forecast firing pattern associated with the received identifier by observing an actual firing pattern of the optical source a plurality of instances after receipt of the identifier; and an optical source module in communication with the optical source, the optical source module configured to provide the forecast firing pattern to the optical source.

20. The prediction apparatus of claim 19, wherein the forecast module is configured to create the forecast firing pattern including analyzing the observed actual firing patterns of the optical source to determine components of the actual firing pattern that are similar across all observed actual firing patterns, and creating the forecast firing pattern from the determined components.

21. The prediction apparatus of claim 20, wherein components of the actual firing pattern are similar across all observed actual firing patterns if there are no noticeable differences at the substrate due to any differences in the components.

22. A method for operating an optical source in accordance with a reduced operating space relative to a full permitted operating space, the method comprising:

receiving an identifier from a photolithography exposure apparatus, the received identifier lacking data relating to an actual firing pattern defining properties of a pulsed light beam produced by the optical source; and providing a forecast firing pattern to the optical source;

wherein the forecast firing pattern is associated with the received identifier and forecasts the actual firing pattern.

23. The method of claim 22, further comprising, prior to providing the forecast firing pattern to the optical source, determining whether a forecast firing pattern has been created and wherein providing the forecast firing pattern to the optical source comprises providing the forecast firing pattern to the optical source only after the forecast firing pattern has been created.

24. The method of claim 23, wherein creating the forecast firing pattern comprises:

observing an actual firing pattern of the optical source a plurality of instances after receipt of the identifier;

analyzing the observed actual firing patterns of the optical source to determine components of the actual firing pattern that are similar across all observed actual firing patterns; and creating the forecast firing pattern from the determined components.

25. The method of claim 22, wherein receiving the identifier comprises receiving the identifier from the photolithography exposure apparatus prior to the optical source producing the pulsed light beam in accordance with the actual firing pattern.

26. The method of claim 22, wherein receiving the identifier comprises receiving the identifier from the photolithography exposure apparatus.

* * * * *